United States Patent
Liu et al.

(10) Patent No.: US 12,261,244 B2
(45) Date of Patent: Mar. 25, 2025

(54) LED STRUCTURE AND PREPARATION METHOD THEREOF

(71) Applicant: ENKRIS SEMICONDUCTOR (WUXI), LTD., Jiangsu (CN)

(72) Inventors: Weihua Liu, Jiangsu (CN); Kai Cheng, Jiangsu (CN)

(73) Assignee: Enkris Semiconductor (Wuxi), Ltd., Wuxi (CN)

( * ) Notice: Subject to any disclaimer, the term of this patent is extended or adjusted under 35 U.S.C. 154(b) by 469 days.

(21) Appl. No.: 17/724,363

(22) Filed: Apr. 19, 2022

(65) Prior Publication Data
US 2023/0066105 A1 Mar. 2, 2023

(30) Foreign Application Priority Data

Aug. 27, 2021 (CN) .......................... 202110996553.7

(51) Int. Cl.
 *H01L 33/32* (2010.01)
 *H01L 33/00* (2010.01)
 *H01L 33/06* (2010.01)
 *H01L 33/38* (2010.01)

(52) U.S. Cl.
 CPC .......... *H01L 33/32* (2013.01); *H01L 33/0075* (2013.01); *H01L 33/06* (2013.01); *H01L 33/382* (2013.01); *H01L 2933/0016* (2013.01)

(58) Field of Classification Search
 CPC ..... H01L 33/32; H01L 33/0075; H01L 33/06; H01L 33/007; H01L 33/24; H01L 33/12
 See application file for complete search history.

(56) References Cited

U.S. PATENT DOCUMENTS

| | | | |
|---|---|---|---|
| 2018/0033911 A1* | 2/2018 | Fujii | H01L 33/0025 |
| 2018/0138358 A1* | 5/2018 | Zhang | H01L 33/22 |

* cited by examiner

*Primary Examiner* — Wasiul Haider
(74) *Attorney, Agent, or Firm* — The Small Patent Law Group LLC; Christopher R. Carroll

(57) ABSTRACT

The present disclosure provides an LED structure and a preparation method thereof. The LED structure includes: a first conductivity semiconductor layer; a stress releasing layer disposed on the first conductivity semiconductor layer, and a material of the stress releasing layer is a III-V group semiconductor material; a V-shaped layer disposed on the stress releasing layer and having V-shaped grooves, where the V-shaped grooves are formed under a control of the stress releasing layer; a multi-quantum well layer, configured to conformally cover a surface of the V-shaped layer away from the stress releasing layer; a second conductivity semiconductor layer disposed on a side of the multi-quantum well layer away from the first conductivity semiconductor layer, where a conductivity type of the second conductivity semiconductor layer is different from that of the first conductivity semiconductor layer.

20 Claims, 2 Drawing Sheets

LED STRUCTURE AND PREPARATION METHOD THEREOF

CROSS REFERENCE TO RELATED APPLICATIONS

This application claims priority to Chinese Patent Application No. 202110996553.7 entitled "LED STRUCTURE AND PREPARATION METHOD THEREOF" filed on Aug. 27, 2021, the entire content of which is incorporated herein by reference.

TECHNICAL FIELD

The present disclosure relates to the field of semiconductor technology and, in particular, to an LED structure and a method of preparing an LED structure.

BACKGROUND

Light emitting diode, or LED for short, uses recombination of electrons and grooves to emit visible light. Two main application areas for LED include: lighting and display. Especially in the display field, future development trends include: longer life, higher image quality and higher definition (more pixels and smaller size pixels). However, existing LED can only emit a single wavelength light.

SUMMARY

The purpose of the present disclosure is to provide an LED structure and a method of preparing an LED structure, which can realize a multi-wavelength LED structure.

According to an aspect of the present disclosure, there is provided an LED structure, including:
- a first conductivity semiconductor layer;
- a stress releasing layer, disposed on the first conductivity semiconductor layer, where a material of the stress releasing layer is a III-V group semiconductor material;
- a V-shaped layer, disposed on the stress releasing layer and having V-shaped grooves, where the V-shaped grooves are formed under a control of the stress releasing layer;
- a multi-quantum well layer, configured to, conformally cover a surface of the V-shaped layer away from the stress releasing layer;
- a second conductivity semiconductor layer, disposed on a side of the multi-quantum well layer away from the first conductivity semiconductor layer, where a conductivity type of the second conductivity semiconductor layer is different from a conductivity type of the first conductivity semiconductor layer.

Further, the material of the stress releasing layer includes one of $Al_yGa_{1-y}N$ and $Al_yIn_xGa_{1-x-y}N$, wherein $0.01 \leq x \leq 0.5$, $0.01 \leq y \leq 0.5$.

Further, a concentration of n-type carriers in the stress releasing layer is less than $5 \times 10^{18}/cm^3$.

Further, a thickness of the stress releasing layer ranges from 10 nm to 500 nm.

Further, at least two of the V-shaped grooves have different depths.

Further, one or more of the V-shaped grooves penetrate through a part of the V-shaped layer in a thickness direction.

Further, the LED structure further includes:
- a first electrode, electrically connected with the first conductivity semiconductor layer;
- a second electrode, electrically connected with the second conductivity semiconductor layer.

Further, the multi-quantum well layer includes a barrier layer, a material of the barrier layer includes Aluminium, and an Aluminium content of a region where the V-shaped grooves are located in the barrier layer is less than an Aluminium content of the barrier layer without the V-shaped grooves.

Further, the material of the stress releasing layer includes Indium, and an Indium content of the stress releasing layer is gradually changed in a thickness direction of the stress releasing layer.

Further, a structure of the stress releasing layer is a multilayer superlattice structure, and/or a structure of the V-shaped layer is a multilayer superlattice structure.

According to one aspect of the present disclosure, there is provided a method of preparing an LED structure, where the method includes:
- growing a stress releasing layer on a first conductivity semiconductor layer, where a material of the stress releasing layer is a III-V group semiconductor material;
- growing a V-shaped layer on the stress releasing layer during which V-shaped grooves are formed in the V-shaped layer under a control of the stress releasing layer;
- growing a multi-quantum well layer to conformally cover a surface of the V-shaped layer away from the stress releasing layer;
- growing a second conductivity semiconductor layer on a side of the multi-quantum well layer away from the first conductivity semiconductor layer, where a conductivity type of the second conductivity semiconductor layer is different from a conductivity type of the first conductivity semiconductor layer.

Further, a growth temperature of the stress releasing layer ranges from 700° C. to 850° C.

Further, the material of the stress releasing layer includes one of $In_xGa_{1-x}N$, $Al_yGa_{1-y}N$ and $Al_yIn_xGa_{1-x-y}N$, where $0.01 \leq x \leq 0.5$, $0.01 \leq y \leq 0.5$.

Further, before growing the multi-quantum well layer, the method further includes etching the V-shaped layer having the V-shaped grooves; or
before growing the V-shaped layer, the method further comprises: etching the stress releasing layer.

In the LED structure and the method of preparing the LED structure of the present disclosure, V-shaped grooves are formed on the surface of the V-shaped layer under the control of the stress releasing layer; the multi-quantum well layer conformally covers a surface of the V-shaped layer away from the stress releasing layer; and by controlling the temperature change during the growth of the multi-quantum well layer, material compositions of different potential well layers located from bottom to top in the multi-quantum well layer are changed, that is, the material compositions of different potential well layers located from bottom to top in the multi-quantum well layer are different; and by controlling the material composition, concentration of n-type carriers, thickness, and growth temperature of the stress releasing layer, the depth and distribution of V-shaped grooves on the V-shaped layer are controlled; and the existence of the V-shaped grooves can cause that carriers in the second conductivity semiconductor layer are injected into the potential well layers of the multi-quantum well layer from sidewalls of the V-shaped grooves, therefore, the light emitting wavelength of the LED structure is changed and a multi-wavelength LED structure is realized.

Figure 1:
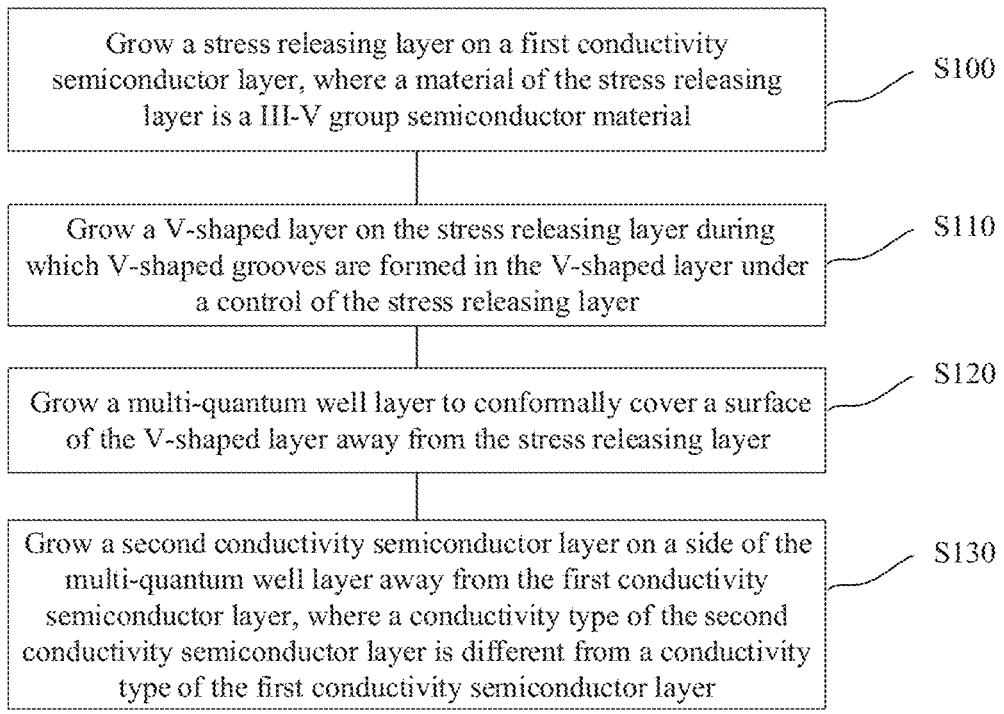
FIG. 1 is a flow chart of a method of preparing an LED structure according to embodiments of the present disclosure.

Description of Reference Signs: first conductivity semiconductor layer 1; stress releasing layer 3; V-shaped layer 3; V-shaped groove 301; multi-quantum well layer 4; barrier layer 401; potential well layer 402; second conductivity semiconductor layer 5; substrate 6; buffer layer 7; first electrode 8; second electrode 9.

DETAILED DESCRIPTION

Here, example embodiments will be described in detail, and examples thereof are shown in the accompanying drawings. In the following description, which refers to the drawings, the same numbers in different drawings represent the same or similarity elements unless otherwise represented. The embodiments described in the following example embodiments do not represent all the embodiments consistent with the present disclosure. On the contrary, they are merely examples of devices consistent with some aspects of the present disclosure as detailed in the appended claims.

The present embodiment provides a method of preparing an LED structure and an LED structure. As shown in FIG. 1, the method of preparing the LED structure can include steps S100 to S130.

At step S100, a stress releasing layer is grown on a first conductivity semiconductor layer, and a material of the stress releasing layer is a III-V group semiconductor material.

At step S110, a V-shaped layer is grown on the stress releasing layer during which V-shaped grooves are formed in the V-shaped layer under a control of the stress releasing layer.

At step S120, a multi-quantum well layer is grown to conformally cover a surface of the V-shaped layer away from the stress releasing layer.

At step S130, a second conductivity semiconductor layer is grown on a side of the multi-quantum well layer away from the first conductivity semiconductor layer, and a conductivity type of the second conductivity semiconductor layer is different from a conductivity type of the first conductivity semiconductor layer.

Figure 2:
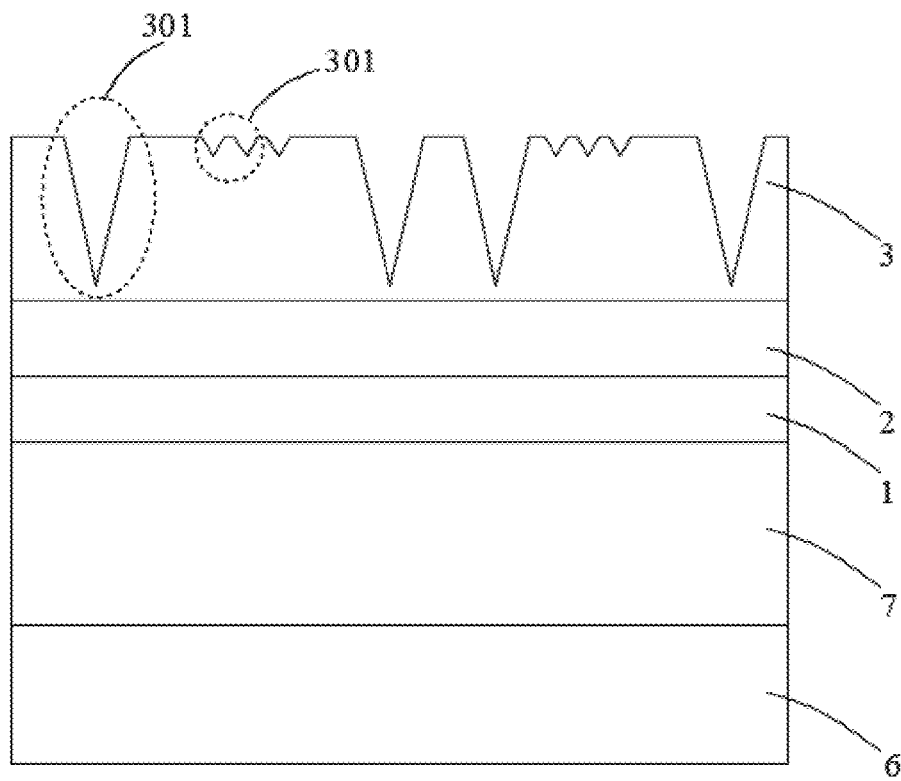
FIG. 2 is a schematic diagram after completion of step S110 according to embodiments of the present disclosure.
Figure 3:
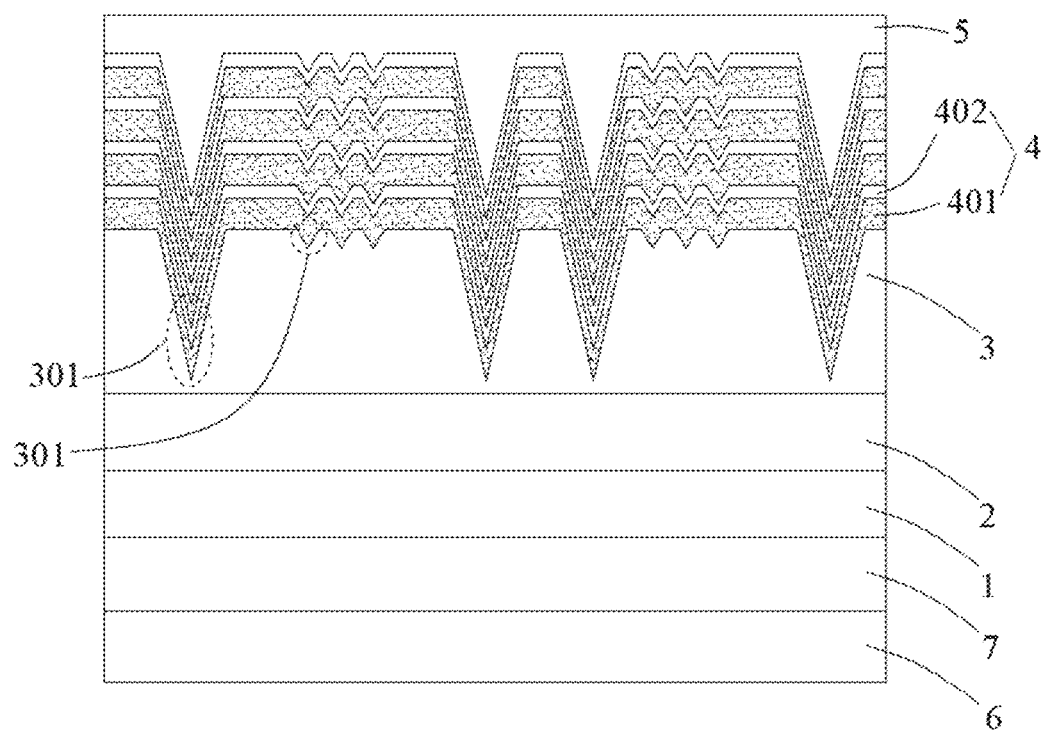
FIG. 3 is a schematic diagram after completion of step S130 according to embodiments of the present disclosure.

In the method of preparing the LED structure according to the embodiments of the present disclosure, as shown in FIG. 2 and FIG. 3, stress releasing layer 2 causes a surface of V-shaped layer 3 to form V-shaped grooves 301, and multi-quantum well layer 4 fills the V-shaped grooves 301, by controlling a temperature change during the growth of the multi-quantum well layer 4, material compositions of different potential well layers 402 located from bottom to top in the multi-quantum well layer 4 are changed, that is, the material compositions of different potential well layers 402 located from bottom to top in the multi-quantum well layer 4 are different; and the existence of the V-shaped grooves 301 can cause that carriers in the second conductivity semiconductor layer 5 are injected into the potential well layers 402 of the multi-quantum well layer 4 from sidewalls of the V-shaped grooves 301, therefore, the light emitting wavelength of the LED structure is changed and a multi-wavelength LED structure is realized.

Steps of the method of preparing the LED structure in the embodiment of the present disclosure are described in detail below.

At step S100, the stress releasing layer is grown on the first conductivity semiconductor layer, and the material of the stress releasing layer is a III-V group semiconductor material.

As shown in FIG. 2, the first conductivity semiconductor layer 1 can be formed on a substrate 6. The substrate 6 can be one of a sapphire substrate, a silicon carbide substrate and a silicon substrate, which is not limited in this embodiment. In addition, before forming the first conductivity semiconductor layer 1, a buffer layer 7 can also be formed on the substrate 6 in the embodiment. The first conductivity semiconductor layer 1 can be grown on the buffer layer 7. The buffer layer 7 can be an intrinsic semiconductor layer, and a material of the buffer layer 7 can be U-type GaN or U-type AlInGaN, which is not limited in the embodiments of the present disclosure.

As shown in FIG. 2, the first conductivity semiconductor layer 1 can be an n-type semiconductor layer. The material of the first conductivity semiconductor layer 1 can be a III-V group semiconductor material, such as, GaN. The first conductivity semiconductor layer 1 can be formed in a reaction chamber by Atomic Layer Deposition (ALD), or Chemical Vapor Deposition (CVD), or Molecular Beam Epitaxy (MBE), or Plasma Enhanced Chemical Vapor Deposition (PECVD), or Low Pressure Chemical Vapor Deposition (LPCVD), or Metal Organic Chemical Vapor Deposition (MOCVD), or a combination thereof.

As shown in FIG. 2, the material of the stress releasing layer 2 can be a III-V group semiconductor material. The stress releasing layer 2 can be an intrinsic semiconductor layer, or a weak n-type semiconductor layer. A concentration of n-type carriers in the stress releasing layer 2 can be less than $5 \times 10^{18}/cm^3$, that is, a number of n-type carriers of the stress releasing layer 2 in per cubic centimeter is less than $5 \times 10^{18}$. In some embodiments, the material of the stress releasing layer 2 can be $In_xGa_{1-x}N$, where $0.01 \leq x \leq 0.5$, and further, $0.01 \leq x \leq 0.3$. The growth process of the stress releasing layer 2 can refer to the growth process of the first conductivity semiconductor layer 1. For example, taking the material of the stress releasing layer 2 being $In_xGa_{1-x}N$ as an example, the growth method of the stress releasing layer 2 can include: simultaneously injecting Indium source, Gallium source, ammonia gas, and carrier gas into the reaction chamber to grow the stress releasing layer 2. A ratio of an amount of substance for injecting the Indium source per unit time to an amount of substance for injecting the Gallium source can be $x/1-x$. An epitaxial growth temperature of the stress releasing layer 2 can range from 700° C. to 850° C., such as, 700° C., 720° C., 760° C., 780° C., 800° C., and so on. An epitaxial growth rate of the stress releasing layer 2 can range from 0.5 μm/h to 2 μm/h, such as, 0.5 μm/h, 1 μm/h, 1.5 μm/h, 2 μm/h, and so on. A thickness of the stress releasing layer 2 can range from 10 nm to 500 nm, such as, 10 nm, 200 nm, 400 nm, 500 nm, and so on. An Indium content of the stress releasing layer 2 changes gradually in a thickness direction of the stress releasing layer 2, for example, the Indium content of the stress releasing layer 2 decreases gradually from bottom to top, or increases gradually from the bottom to the top. Since the Indium content of the stress releasing layer 2 changes gradually in the thickness direction of the stress releasing layer 2, the forming process of the V-shaped grooves 301 during the growth of the V-shaped layer 3 can be controlled, and thus depths of the V-shaped grooves 301 can be controlled. A structure of the stress releasing layer 2 can be a multilayer superlattice structure.

At step S110, the V-shaped layer is grown on the stress releasing layer during which V-shaped grooves are formed in the V-shaped layer.

As shown in FIG. 2, a material of the V-shaped layer 3 can be a III-V group compound. A structure of the V-shaped layer 3 can be a single-layer structure or a multi-layer structure, for example, a material of the single-layer structure can include InGaN, and the multi-layer structure can include InGaN layers and GaN layers that are alternately distributed. The V-shaped layer 3 can be doped with n-type ions to exhibit n-type conductivity. The growth process of the V-shaped layer 3 can refer to the growth process of the first conductivity semiconductor layer 1. The V-shaped layer 3 is formed on the surface of the stress releasing layer 2 away from the first conductivity semiconductor layer 1. Due to differences in the thermal expansion coefficient, lattice constant, and built-in stress between the V-shaped layer 3 and the stress releasing layer 2, the V-shaped grooves 301 are formed on the surface of the V-shaped layer 3 away from the first conductivity semiconductor layer 1. At least two of the V-shaped grooves 301 have different depths. In addition, one or more of the V-shaped grooves 301 can penetrate through a part of the V-shaped layer 3 in the thickness direction.

By adjusting the material composition of the stress releasing layer 2, the concentration of n-type carriers in the stress releasing layer 2 and the epitaxial growth temperature of the stress releasing layer 2, the V-shaped grooves 301 with a controllable number and size can be formed. In some embodiments, a density of the V-shaped grooves 301 with a smaller depth on the V-shaped layer 3 is positively correlated with the Indium content of the stress releasing layer 2, that is, the greater the Indium content of the stress releasing layer 2 is, the greater the density of the V-shaped grooves 301 with the smaller depth on the V-shaped layer 3 is. A density of the V-shaped grooves 301 with a larger depth on the V-shaped layer 3 is positively correlated with the concentration of n-type carriers of the stress releasing layer 2, that is, the greater the concentration of the n-type carriers of the stress releasing layer 2 is, the greater the density of the V-shaped grooves 301 with the larger depth on the V-shaped layer 3 is. The density of the V-shaped grooves 301 with the larger depth on the V-shaped layer 3 is positively correlated with the epitaxial growth temperature of the stress releasing layer 2, that is, the greater the epitaxial growth temperature of the stress releasing layer 2 is, the greater the density of the V-shaped grooves 301 with the larger depth on the V-shaped layer 3 is. The Indium content can be a percentage of an amount of substance for Indium to a sum of amounts of substances for all positively charged elements in the stress releasing layer 2. For example, the material of the stress releasing layer 2 can include $In_xGa_{1-x}N$, and the Indium content refers to the percentage of the amount of substance for Indium to a sum of amount of substance for Indium and amount of substance for Gallium. In the present disclosure, the V-shaped grooves 301 with a depth less than 3 nm can be determined as the V-shaped grooves 301 with the smaller depth, and the V-shaped groove 301 with a depth greater than or equal to 3 nm can be determined as the V-shaped groove 301 with the larger depth, the embodiments of the present disclosure are not particularly limited to this. A structure of the V-shaped layer 3 can be a multilayer superlattice structure.

In addition, before growing the V-shaped layer 3, the method of preparing the LED structure further includes etching the stress releasing layer 2 to form V-shaped recesses on the stress releasing layer 2. The V-shaped layer 3 can conformally cover the stress releasing layer 2, and a region on the V-shaped layer 3 corresponding to the V-shaped recesses can form the V-shaped grooves 301. Before etching the stress releasing layer 2, a dislocation density of the stress releasing layer 2 can be tested, and then a region with a large dislocation density in the stress releasing layer 2 can be selected to be etched.

At step S120, a multi-quantum well layer is grown to conformally cover the surface of the V-shaped layer away from the stress releasing layer.

As shown in FIG. 3, the multi-quantum well layer 4 can include one or more potential well layers 402 and one or more barrier layers 401 alternately arranged. A material of the one or more potential well layers 402 can include InGaN, and a material of the one or more barrier layers 401 can include GaN or AlGaN, the embodiments of the present disclosure are not particularly limited to this. The growth processes of the potential well layers 402 and the barrier layers 401 can refer to the growth process of the first conductivity semiconductor layer 1.

In embodiments of the present disclosure, by controlling the temperature change during the growth of the multi-quantum well layer 4, material compositions of different potential well layers 402 located from bottom to top in the multi-quantum well layer 4 are changed, for example, by controlling the temperature change during the growth of the multi-quantum well layer 4, Indium contents of the different potential well layers 402 located from bottom to top in the multi-quantum well layer 4 are changed. The multi-quantum well layer 4 can conformally cover the surface of the V-shaped layer 3 disposed with the V-shaped grooves 301, that is, shapes of the filled V-shaped grooves 301 are still V-shaped.

An Aluminum content of a region where the V-shaped grooves 301 are located in the barrier layer 401 is less than an Aluminum content of other region in the barrier layer 401, where the other region refers to a region in the barrier layer 401 without the V-shaped grooves 301, thereby it is easier for holes to penetrate through the V-shaped grooves 301 in the barrier layer 401. In this way, the holes are injected into a light-emitting region (the region where the V-shaped grooves are not located) in deeper potential well layers 402 through sidewalls of the V-shaped grooves 301 to combine with electrons to emit light, thereby improving a luminous efficiency.

In addition, in the process of epitaxially growing a barrier layer 401, a growth rate of the region where the V-shaped grooves 301 are located in the barrier layer 401 is less, so that a thickness of the region where the V-shaped grooves 301 are located in the barrier layer 401 is less. In this way, with this arrangement, it is easier for holes to penetrate through the region where the V-shaped grooves 301 are located in the barrier layer 401 to be injected into deeper potential well layers 402 to combine with the electrons to emit light, thereby improving the luminous efficiency. It should be noted that the region where the V-shaped grooves 301 are located in the potential well layer 402 is not a light-emitting region. The holes are injected into the potential well layers 402 without the V-shaped grooves, through sidewalls of the light-emitting region exposed by the V-shaped grooves 301, and due to Indium contents are different in different potential well layers 402, emitting wavelengths of the LED structure are different, thereby implementing a multi-wavelength LED structure.

In an embodiment of the present disclosure, an Aluminium content of a barrier layer 401 located at the bottom is uniform in the thickness direction. In another embodiment of the present disclosure, for a plurality of barrier layers 401, the Aluminium contents of the barrier layers 401 gradually decrease from bottom to top, in other words, Aluminium contents of the barrier layers 401 located at lower are greater than Aluminium contents of the barrier layers 401 located at upper. In other embodiments of the present disclosure, the Aluminium content of the barrier layer 401 located at the bottom is gradually changed in the thickness direction and gradually decreases from bottom to top, for example, the Aluminium content of the region where the V-shaped grooves 301 are located in the barrier layer 401 gradually decreases from 5% to 0, and the Aluminium content of other region in the barrier layer 401 gradually decreases from 20% to 0, where the other region refers to a region in the barrier layer 401 without the V-shaped grooves 301. The Aluminium content can be a percentage of an amount of substance for Aluminium to a sum of amounts of substances for all positively charged elements in the barrier layer 401.

In another embodiment, before growing the multi-quantum well layer 4, the method of preparing the LED structure further includes etching the V-shaped layer 3 having the V-shaped grooves 301 to further expand depths of the V-shaped grooves 301, to facilitate that carriers of the second conductivity semiconductor layer 5 are injected into a potential well layer located at the bottom from sidewalls of the V-shaped grooves 301. In some embodiments of the present disclosure, after the V-shaped layer 3 is formed, a dislocation density of the V-shaped layer 3 can be tested, and a region with a larger dislocation density in the V-shaped layer 3 can be selected to be etched.

In addition, an Indium content of the V-shaped grooves 301 with a smaller depth in the potential well layer 402 is different from an Indium content of the V-shaped groove 301 with a larger depth in the potential well layer 402. The Indium content of the potential well layer 402 will affect the emitting wavelength of the multi-quantum well layer 4. The greater the Indium content of the potential well layer 402 is, the longer the emitting wavelength of the multi-quantum well layer 4 is; the smaller the Indium content of the potential well layer 402 is, the shorter the emitting wavelength of the multi-quantum well layer 4 is; in the present disclosure, because the Indium contents of the multi-quantum well layer 4 with different depths are different, the LED structure can emit light of different wavelengths, and thereby implementing white light illumination or display.

At step S130, a second conductivity semiconductor layer is grown on a side of the multi-quantum well layer away from the first conductivity semiconductor layer, and a conductivity type of the second conductivity semiconductor layer is different from a conductivity type of the first conductivity semiconductor layer.

As shown in FIG. 3, the second conductivity semiconductor layer 5 can be a p-type semiconductor layer. A material of the second conductivity semiconductor layer 5 can be a III-V group semiconductor material, such as, GaN. The growth process of the first conductivity semiconductor layer 1 can refer to the growth process of the first conductivity semiconductor layer 1.

The present disclosure further provides an LED structure. The LED structure is manufactured by the above-mentioned method of preparing the LED structure, and therefore, the LED structure has same beneficial effects, which will not be repeated in this disclosure.

The LED structure and a preparation method thereof in some embodiments of the present disclosure are substantially the same as the LED structure and the preparation method thereof in above-mentioned embodiments of the present disclosure, except for the material of the stress releasing layer 2. The material of the stress releasing layer 2 can be $Al_yGa_{1-y}N$, where $0.01 \leq y \leq 0.5$, and further, $0.01 \leq y \leq 0.3$.

The LED structure and a preparation method thereof in some embodiments of the present disclosure are substantially the same as the LED structure and the preparation method thereof in above-mentioned embodiments of the present disclosure, except for the material of the stress releasing layer 2. The material of the stress releasing layer 2 can be $Al_yIn_xGa_{1-y}N$, where $0.01 \leq x \leq 0.3$, $0.01 \leq y \leq 0.3$, and further, $0.01 \leq x \leq 0.5$, $0.01 \leq y \leq 0.5$.

Figure 4:
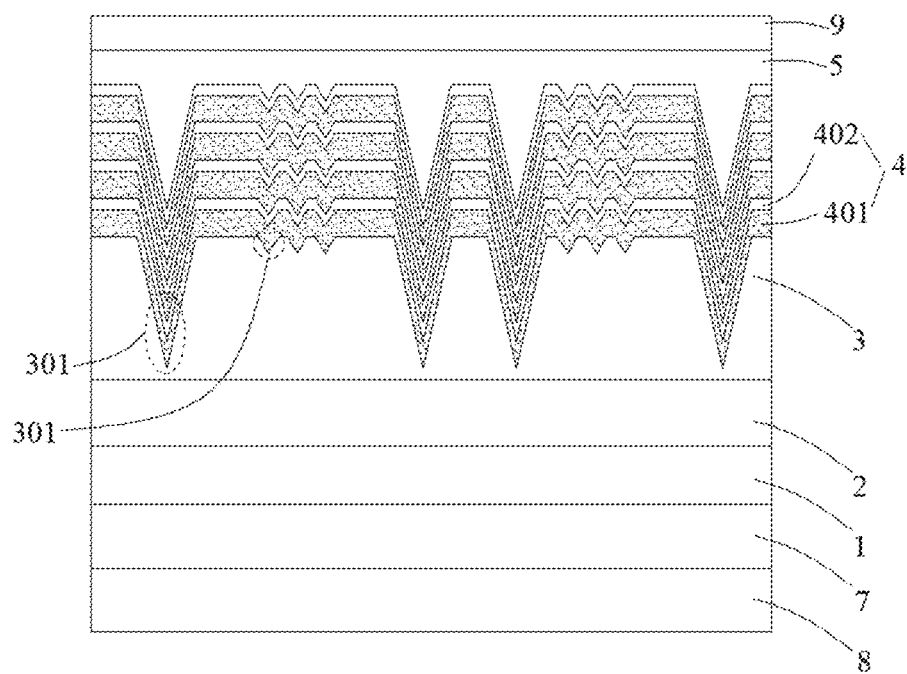
FIG. 4 is a schematic diagram of an LED structure having a first electrode and a second electrode according to embodiments of the present disclosure.

The LED structure and a preparation method thereof in some embodiment of the present disclosure are substantially the same as the LED structure and the preparation method thereof in above-mentioned embodiments of the present disclosure, except that: as shown in FIG. 4, the method of preparing the LED structure includes forming a first electrode 8 electrically connected with the first conductivity semiconductor layer 1 and a second electrode 9 electrically connected with the second conductivity semiconductor layer 5. The substrate 6 can be removed or not. Taking the first conductivity semiconductor layer 1 as an n-type semiconductor layer and the second conductivity semiconductor layer 5 as a p-type semiconductor layer as an example, the first electrode 8 is an n-type electrode, and the second electrode 9 is a p-type electrode. A material of the first electrode 8 and a material of the second electrode 9 can be selected from at least one of gold, silver, aluminium, chromium, nickel, platinum, or titanium.

The above-mentioned is only preferred embodiments of the present disclosure and does not limit the present disclosure in any form. Although the present disclosure has been disclosed as above in the preferred embodiments, it is not intended to limit the present disclosure. Any skilled person familiar with the art without departing from the scope of the technical solution of the present disclosure, shall be able to make some changes or modifications to the above disclosed technical contents into equivalent embodiments with equivalent changes by using the above disclosed technical content. Any simple modifications, equivalent changes, and modifications to the above embodiments according to the technical essence of the present disclosure without departing from the scope of the technical solution of the present disclosure still belong to the scope of the technical solution of the present disclosure.

What is claimed is:

1. An LED structure, comprising:
   a first conductivity semiconductor layer;
   a stress releasing layer, disposed on the first conductivity semiconductor layer, wherein a material of the stress releasing layer is a III-V group semiconductor material;
   a V-shaped layer, disposed on the stress releasing layer and having V-shaped grooves, wherein the V-shaped grooves are formed under a control of the stress releasing layer;

a multi-quantum well layer, configured to, conformally cover a surface of the V-shaped layer away from the stress releasing layer; and a second conductivity semiconductor layer, disposed on a side of the multi-quantum well layer away from the first conductivity semiconductor layer, wherein a conductivity type of the second conductivity semiconductor layer is different from a conductivity type of the first conductivity semiconductor layer.

2. The LED structure according to claim 1, wherein the material of the stress releasing layer comprises one of $In_xGa_{1-x}N$, $Al_yGa_{1-y}N$ and $Al_yIn_xGa_{1-x-y}N$, wherein $0.01 \leq x \leq 0.5$, $0.01 \leq y \leq 0.5$.

3. The LED structure according to claim 1, wherein a concentration of n-type carriers in the stress releasing layer is less than $5 \times 10^{18}/cm^3$.

4. The LED structure according to claim 1, wherein a thickness of the stress releasing layer ranges from 10 nm to 500 nm.

5. The LED structure according to claim 1, wherein at least two of the V-shaped grooves have different depths.

6. The LED structure according to claim 1, wherein one or more of the V-shaped grooves penetrate through a part of the V-shaped layer in a thickness direction.

7. The LED structure according to claim 1, wherein the LED structure further comprises:
a first electrode, electrically connected with the first conductivity semiconductor layer; and
a second electrode, electrically connected with the second conductivity semiconductor layer.

8. The LED structure according to claim 1, wherein the multi-quantum well layer comprises one or more barrier layers, a material of the one or more barrier layers comprises Aluminium, and an Aluminium content of a region where the V-shaped grooves are located in the one or more barrier layers is less than an Aluminium content of the one or more barrier layers without the V-shaped grooves.

9. The LED structure according to claim 8, wherein an Aluminium content of a barrier layer located at bottom is uniform in a thickness direction.

10. The LED structure according to claim 1, wherein the material of the stress releasing layer comprises Indium, and an Indium content of the stress releasing layer is gradually changed in a thickness direction of the stress releasing layer.

11. The LED structure according to claim 1, wherein a structure of the stress releasing layer is a multilayer superlattice structure.

12. The LED structure according to claim 1, wherein a structure of the V-shaped layer is a multilayer superlattice structure.

13. The LED structure according to claim 1, wherein the V-shaped layer is doped with n-type ions.

14. A method of preparing an LED structure, comprising:
growing a stress releasing layer on a first conductivity semiconductor layer, wherein a material of the stress releasing layer is a III-V group semiconductor material;
growing a V-shaped layer on the stress releasing layer during which V-shaped grooves are formed in the V-shaped layer under a control of the stress releasing layer;
growing a multi-quantum well layer to conformally cover a surface of the V-shaped layer away from the stress releasing layer; and
growing a second conductivity semiconductor layer on a side of the multi-quantum well layer away from the first conductivity semiconductor layer, wherein a conductivity type of the second conductivity semiconductor layer is different from a conductivity type of the first conductivity semiconductor layer.

15. The method of preparing the LED structure according to claim 14, wherein a growth temperature of the stress releasing layer ranges from 700° C. to 850° C.

16. The method of preparing the LED structure according to claim 14, wherein the material of the stress releasing layer comprises one of $In_xGa_{1-x}N$, $Al_yGa_{1-y}N$ and $Al_yIn_xGa_{1-x-y}N$, wherein $0.01 \leq x \leq 0.5$, $0.01 \leq y \leq 0.5$.

17. The method of preparing the LED structure according to claim 14, wherein, before growing the multi-quantum well layer, the method further comprises:
etching the V-shaped layer having the V-shaped grooves.

18. The method of preparing the LED structure according to claim 14, wherein, before growing the V-shaped layer, the method further comprises:
etching the stress releasing layer.

19. The method of preparing the LED structure according to claim 18, wherein, before etching the stress releasing layer, the method further comprises:
testing a dislocation density of the stress releasing layer, and etching a region with a large dislocation density in the stress releasing layer.

20. The method of preparing the LED structure according to claim 14, the method further comprises:
controlling a temperature change during growth of the multi-quantum well layer to change Indium contents of different potential well layers located from bottom to top in the multi-quantum well layer.

* * * * *